(12) United States Patent
Park et al.

(10) Patent No.: US 10,991,400 B2
(45) Date of Patent: Apr. 27, 2021

(54) INTEGRATED CIRCUIT

(71) Applicant: SK hynix Inc., Gyeonggi-do (KR)

(72) Inventors: Heat-Bit Park, Gyeonggi-do (KR);
Ji-Hwan Kim, Seoul (KR); Dong-Uk Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 16 days.

(21) Appl. No.: 16/221,757

(22) Filed: Dec. 17, 2018

(65) Prior Publication Data

US 2019/0371371 A1 Dec. 5, 2019

(30) Foreign Application Priority Data

May 31, 2018 (KR) .................. 10-2018-0062758

(51) Int. Cl.
*G11C 7/10* (2006.01)

(52) U.S. Cl.
CPC .......... *G11C 7/1051* (2013.01); *G11C 7/1006* (2013.01)

(58) Field of Classification Search
CPC .................................................. G11C 7/1051
See application file for complete search history.

(56) References Cited

U.S. PATENT DOCUMENTS

| 5,590,086 A | * | 12/1996 | Park | G11C 11/4076 365/149 |
| 6,952,115 B1 | * | 10/2005 | Andrews | G11C 7/1051 326/41 |
| 7,990,777 B2 | | 8/2011 | Rha | |
| 2003/0058896 A1 | * | 3/2003 | Boerker | H04J 3/047 370/532 |

FOREIGN PATENT DOCUMENTS

KR 101096185 12/2011

* cited by examiner

*Primary Examiner* — Douglas King
(74) *Attorney, Agent, or Firm* — IP & T Group LLP

(57) ABSTRACT

An integrated circuit includes: one or more first sections in which first to $N^{th}$ data (where N is an integer equal to or greater than 2) corresponding to one command are transferred through one line; and two or more second sections in which the first to $N^{th}$ data are serial-to-parallel converted in 1:N and transferred through N lines, wherein whenever the command is applied, the first to $N^{th}$ data are transferred without being inverted or transferred after being inverted repeatedly in at least one second section among the two or more second sections.

9 Claims, 4 Drawing Sheets

INTEGRATED CIRCUIT

CROSS-REFERENCE TO RELATED APPLICATION

The present application claims priority of Korean Patent Application No. 10-2018-0062758, filed on May 31, 2018, which is incorporated herein by reference in its entirety.

BACKGROUND

1. Field

Various embodiments of the present invention relate to an integrated circuit.

2. Description of the Related Art

A large amount of data are transferred in various integrated circuits, such as a memory, a central processing unit (CPU), and a graphic processing unit (GPU). Current is consumed when data are transferred. Peak current consumed during data transfer depends on patterns of the transferred data. When data toggles many times, the current consumption of the integrated circuit instantaneously increases. On the other hand, when the data are maintained at a constant level without toggles, the current consumption decreases. In most integrated circuits, the total current consumed by an integrated circuit is an important performance factor, and the peak current of the integrated circuit is also a very important performance factor as well. If the instantaneous current consumption of the integrated circuit increases, that may cause a large amount of noise in the power, and in some cases, the power supply may become insufficient. Therefore, there is a need for a technology that reduces the amount of peak current consumed in transferring data within an integrated circuit.

SUMMARY

Embodiments of the present invention are directed to an integrated circuit that reduces peak current occurring due to data transfer.

In accordance with an embodiment of the present invention, an integrated circuit includes: one or more first sections in which first to $N^{th}$ data, where N is an integer greater than or equal to 2, corresponding to one command are transferred through one line; and two or more second sections in which the first to $N^{th}$ data are serial-to-parallel converted in 1:N and transferred through N lines, wherein whenever the command is applied, the first to $N^{th}$ data are transferred without being inverted or transferred after being inverted repeatedly in at least one second section among the two or more second sections.

In accordance with another embodiment of the present invention, an integrated circuit includes: a first section in which first to fourth data corresponding to one command are transferred through one line; a second section in which the first to fourth data transferred through the first section are serial-to-parallel converted 1:2 and transferred through two lines; a third section in which the first to fourth data transferred through the second section are serial-to-parallel converted 2:4 and transferred through four lines; a fourth section in which the first to fourth data transferred through the third section are parallel-to-serial converted 4:2 and transferred through two lines; a fifth section in which the first to fourth data transferred through the fourth section are serial-to-parallel converted 2:4 and transferred through four lines; and a sixth section in which the first to fourth data transferred through the fifth section are parallel-to-serial converted 4:2 and transferred through two lines, wherein select data among the first to fourth data is inverted and transferred in at least one section among the second section, the fourth section, and the sixth section, and whenever the command is applied, the first to fourth data are transferred without being inverted or transferred after being inverted repeatedly in at least one section among the third section and the fifth section.

In accordance with another embodiment of the present invention, an integrated circuit including a plurality of stacked chips, the integrated circuit includes: a plurality of data paths, including odd-numbered data paths and even-numbered data paths; and a circuit suitable for changing a data pattern in at least one of the data paths such that a data pattern of one of the odd-numbered data paths is different from data patterns of the other odd-numbered data paths or a data pattern of one of the even-numbered data paths is different from data patterns of the other even-numbered data paths.

DETAILED DESCRIPTION

Figure 1:
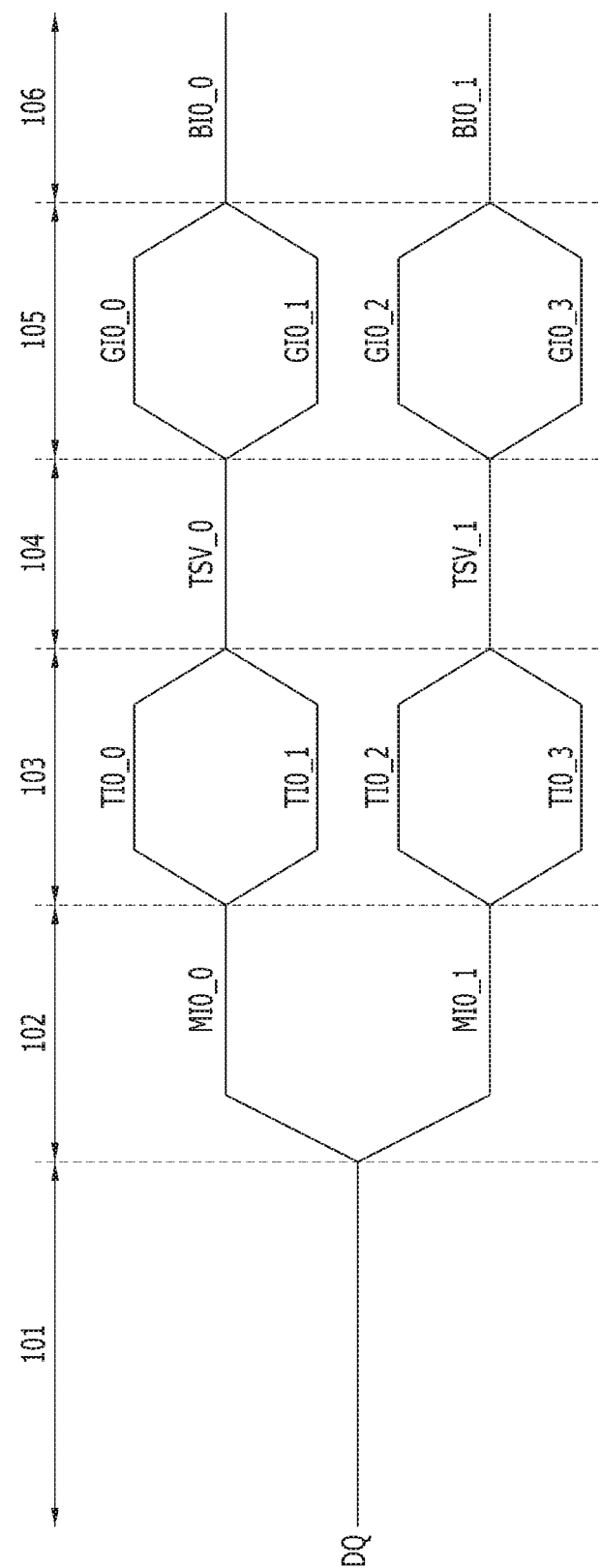
FIG. 1 illustrates sections of data transfer in an integrated circuit in accordance with an embodiment of the present invention.

Various embodiments of the present invention will be described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

FIG. 1 illustrates sections of data transfer in an integrated circuit in accordance with an embodiment of the present invention. FIG. 1 shows paths or sections through which data are transferred within the integrated circuit. By way of example, the integrated circuit is a memory device.

Referring to FIG. 1, data received through a data pad DQ may be transferred through one line in a section 101.

In a section 102, data transferred through the section 101 may be converted from serial to parallel, i.e., 1:2 conversion, and transferred through two lines MIO_0 and MIO_1.

In a section 103, data transferred through the section 102 may be again converted from serial to parallel, i.e., 2:4 conversion, and transferred through four lines TIO_0 to TIO_3. In other words, the data of the section 103 may be regarded as having been serial-to-parallel converted 1:4 and transferred through the four lines TIO_0 to TIO_3 relative to the data of the section 101.

In a section 104, data transferred through the section 103 may be converted from parallel to serial, i.e., 4:2 conversion, and transferred through two lines TSV_0 and TSV_1. In other words, the data transferred in the section 104 may be regarded as having been serial-to-parallel converted 1:2 and transferred through the two lines TSV_0 and TSV_1 relative to the data of the section 101.

In a section 105, data transferred through the section 104 may be converted from serial to parallel, i.e., 2:4 conversion, and transferred through the four lines GIO_0 to GIO_3. In other words, the data of the section 105 may be regarded as having been serial-to-parallel converted 1:4 and transferred through the four lines GIO_0 to GIO_3 relative to the data of the section 101.

In a section 106, data transferred through the section 105 may be converted from parallel to serial, i.e., 4:2 conversion, and transferred through 2 lines BIO_0 and BIO_1. In other words, the data of the section 106 may be regarded as having been serial-to-parallel converted 1:2 and transferred through the two lines BIO_0 and BIO_1 relative to the data of the section 101.

Figure 2:
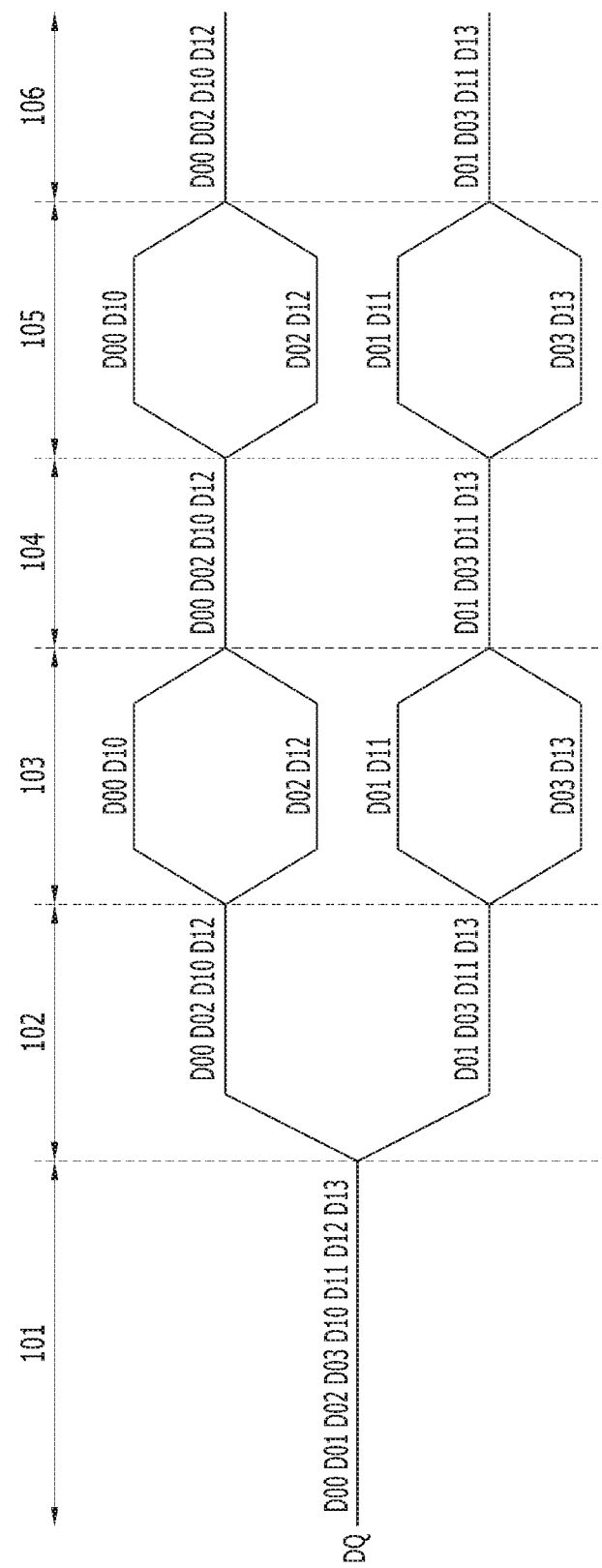
FIG. 2 illustrates an example of data transferred in sections in an integrated circuit.

FIG. 2 illustrates an example of data transferred in sections, e.g., the sections 101 to 106 of FIG. 1, in an integrated circuit.

In FIG. 2, four data, corresponding to one command, e.g., a write command, are consecutively inputted to one data pad DQ. That is, a burst length BL is 4. In other words, FIG. 2 shows that two commands are consecutively applied and eight data corresponding to the two commands are successively input to the data pad DQ. This arrangement is data arrangement is exemplary.

Referring to FIG. 2, four data D00, D01, D02 and D03 corresponding to the first command and four data D10, D11, D12 and D13 corresponding to the second command may be serially transferred through a line in the section 101. Note that the line identifiers used in FIG. 1 are applicable to FIG. 2, although they are not included in FIG. 2 for clarity.

In the section 102, four data D00, D01, D02 and D03 corresponding to the first command may be serial-to-parallel converted 1:2 and transferred, and four data D10, D11, D12 and D13 corresponding to the second command may be serial-to-parallel converted 1:2 and transferred. D00, D02, D10 and D12 may be transferred through line MIO_0, and D01, D03, D11 and D13 may be transferred through line MIO_1.

In the section 103, four data D00, D01, D02 and D03 corresponding to the first command may be serial-to-parallel converted 1:4 and transferred, relative to the data in the section 101, and four data D10, D11, D12 and D13 corresponding to the second command may be serial-to-parallel converted 1:4 and transferred, relative to the data in the section 101. D00 and D10 may be transferred through line TIO_0, D02 and D12 may be transferred through line TIO_1, D01 and D11 may be transferred through line TIO_2, and D03 and D13 may be transferred through line TIO_3.

Since the data D00, D01, D02, D03, D10, D11, D12 and D13 are transferred through two lines in the section 104 just as in the section 102, the data D00, D01, D02, D03, D10, D11, D12 and D13 may be transferred in the section 104 in the same manner as in the section 102. In the section 104, the data is transferred through lines TSV_0 and TSV_1 as shown.

Since the data D00, D01, D02, D03, D10, D11, D12 and D13 are transferred through the four lines in the section 105 just as in the section 103, the data D00, D01, D02, D03, D10, D11, D12 and D13 may be transferred in the section 105 in the same manner as in the section 103. In the section 105, the data is transferred through lines GIO_0, GIO_1, GIO_2 and GIO_3 as shown.

Since the data D00, D01, D02, D03, D10, D11, D12 and D13 are transferred through the two lines in the section 106 just as in the section 102 and the section 104, the data D00, D01, D02, D03, D10, D11, D12 and D13 may be transferred in the section 106 in the same manner as in the section 102 and the section 104. In the section 106, the data is transferred through lines BIO_0 and BIO_1 as shown.

When the pattern of data D00, D01, D02, D03, D10, D11, D12 and D13 is (0, 0, 1, 1, 0, 0, 1, 1), the data of the line MIO_0 of the section 102 may become (0, 1, 0, 1), and the data of the line MIO_1 may also become (0, 1, 0, 1). Likewise, the data of the lines TSV_0 and TSV_1 of the section 104 may become (0, 1, 0, 1), and the data of the lines BIO_0 and BIO_1 of the section 106 may also become (0, 1, 0, 1). In other words, data of six lines MIO_0, MIO_1, TSV_0, TSV_1, BIO_0 and BIO_1 of the section 102, the section 104 and the section 106 may fully toggle at the same, or substantially the same, time. In this case, the peak current of the integrated circuit may become very high, causing a large amount of noise in the integrated circuit.

When the pattern of data D00, D01, D02, D03, D10, D11, D12 and D13 is (0, 0, 0, 0, 1, 1, 1, 1), the data of the line TIO_0 of the section 103 may become (0, 1), and the data of the lines TIO_1 to TIO_3 may also become (0, 1). Likewise, the data of the four lines GIO_0 to GIO_3 of the section 105 may become (0, 1). In other words, data of eight lines TIO_0 to TIO_3 and GIO_0 to GIO_3 of the section 103 and the section 105 may fully toggle at the same, or substantially the same, time. In this case, the peak current of the integrated circuit may become very high, causing a large amount of noise in the integrated circuit.

To sum up, the data patterns in the lines MIO_0, MIO_1, TSV_0, TSV_1, BIO_0 and BIO_1 of the section 102, the section 104, and the section 106 are the same. Therefore, when the data D00, D01, D02, D03, D10, D11, D12, and D13 have a specific pattern, the peak current may rise in the section 102, the section 104, and the section 106 at the same, or substantially the same, time. Also, since the data patterns in the lines TIO_0 to TIO_3 and GIO_0 to GIO_3 of the section 103 and the section 105 are the same, when the data D00, D01, D02, D03, D10, D11, D12 and D13 has a specific pattern, the peak current may rise almost simultaneously in the section 103 and the section 105.

Figure 3:
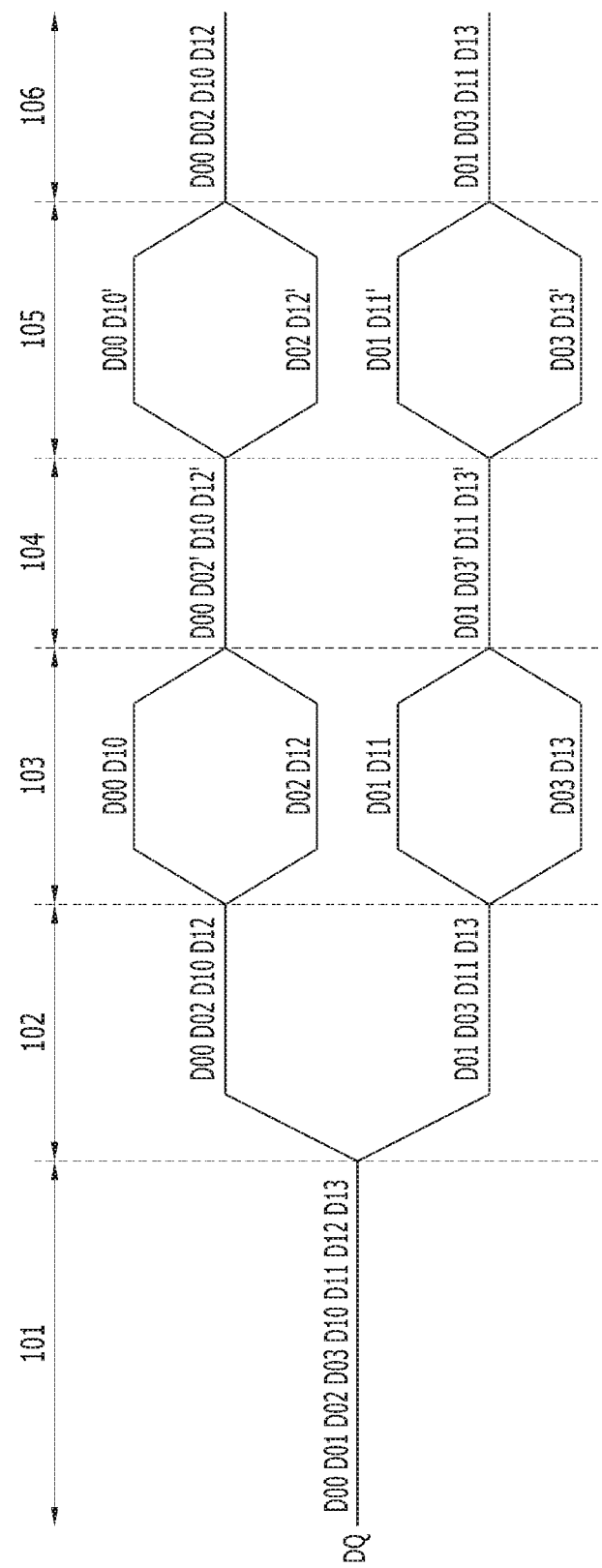
FIG. 3 illustrates a method for resolving a concern of increasing peak current according to the pattern of data in data transfer sections.

FIG. 3 illustrates a method for resolving a concern of increasing peak current according to the pattern of data in transfer sections, e.g., the pattern of the data D00, D01, D02, D03, D10, D11, D12 and D13 in the sections 101 to 106 of FIG. 1.

As shown in FIG. 2, when the patterns of the data in the lines MIO_0, MIO_1, TSV_0, TSV_1, BIO_0 and BIO_1 in the sections 102, 104 and 106 are the same and the patterns of the data in the lines TIO_0 to TIO_3 and GIO_0 to GIO_3 in the sections 103 and 105 are the same, the peak current of the integrated circuit may rise. This concern may be solved by changing the pattern of the data in at least one section among the sections 102, 104 and 106 and changing the pattern of the data in at least one section among the sections 103 and 105.

Referring to FIG. 3, it may be seen that the third data and fourth data among the data D00, D01, D02, and D03 corresponding to the first command in the section 104 are inverted and transferred. In FIG. 3, apostrophe (') may represent that the corresponding data is inverted. The data pattern may become D00, D02' in the line TSV_0 of the section 104, and the data pattern may become D01, D03' in the line TSV_1. This is different from the data pattern being D00, D02 in the lines MIO_0 and BIO_0 of the sections 102 and 106 and the data pattern being D01, D03 in the lines MIO_1 and BIO_1. Therefore, although the data of the lines MIO_0, MIO_1, BIO_0, and BIO_1 fully toggle in the sections 102 and 106, the data of the lines TSV_0 and TSV_1 may not toggle in the section 104, which may mean that the worst situation in which the data toggles at the same, or substantially the same, time in the sections 102, 104, and 106 and the peak current surges does not occur.

In the section 105, the data D00, D01, D02, and D03 corresponding to the first command are transferred as they are, and the data D10, D11, D12, and D13 corresponding to the second command are transferred after being inverted. The inverted data are represented as D10', D11', D12', and D13'. In the section 105, the data pattern of the line GIO_0 may become D00, D10', the data pattern of the line GIO_1 may become D02, D12', the data pattern of the line GIO_2 may become D01, D11', and the data pattern of the line GIO_3 may become D03, D13'. This is different from a case in which the data pattern of the lines TIO_0 to TIO_3 in the section 103 is D00, D10 on TIO_0, D02, D12 on TIO_1, D01, D11 on TIO_2, and D03, D13 on TIO_3. Therefore, although the data of the lines TIO_0 to TIO_3 fully toggle in the section 103, the data of the lines GIO_0 to GIO_3 may not fully toggle in the section 105, which may mean that the worst situation, in which the data fully toggle at the same, or substantially the same, time in the sections 103 and 105 and the peak current rapidly surges, does not occur.

Figure 4:
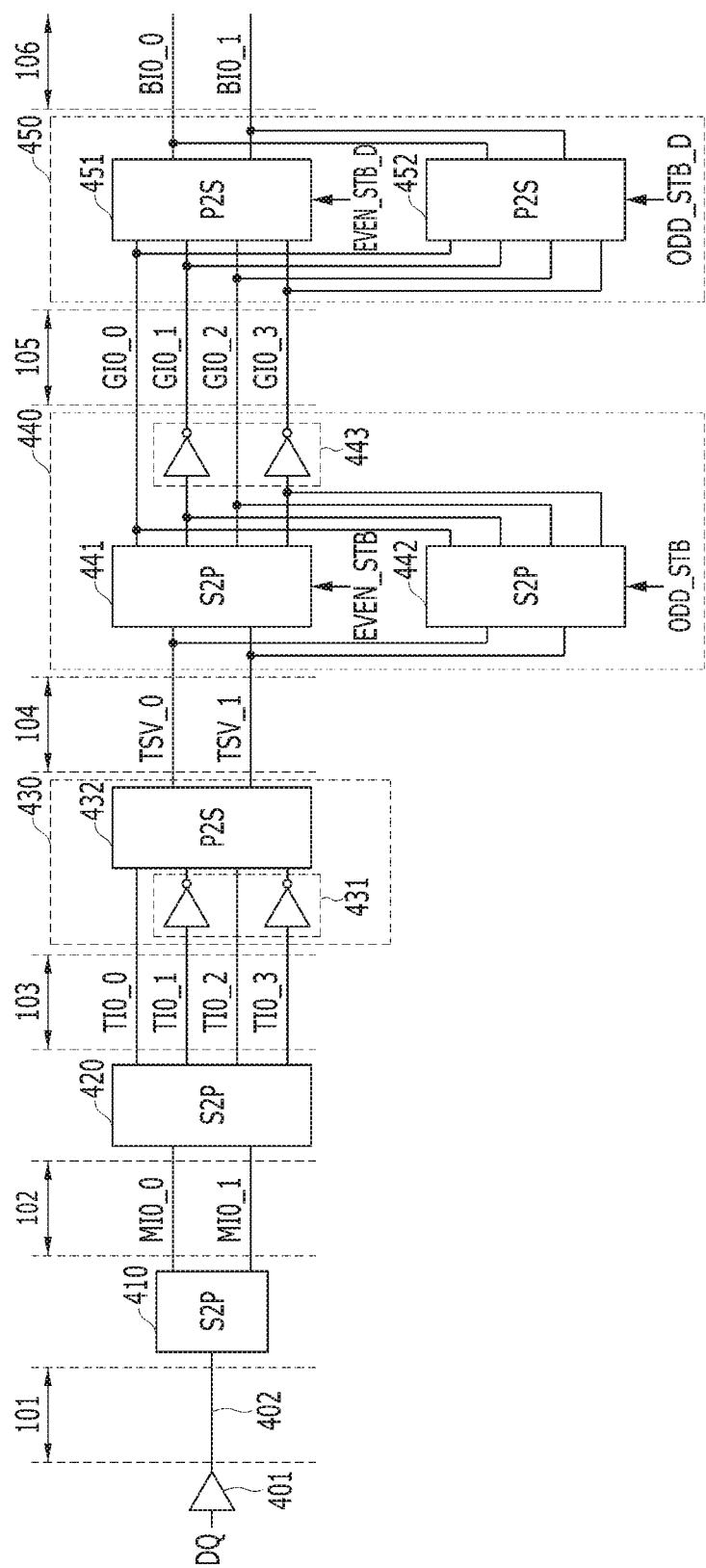
FIG. 4 is a block diagram illustrating an integrated circuit in accordance with an embodiment of the present invention.

FIG. 4 is a block diagram illustrating an integrated circuit, e.g., the integrated circuit of FIG. 1, in accordance with an embodiment of the present invention. In FIG. 4, constituent elements for transferring data in an integrated circuit as shown in FIG. 3 will be described.

Referring to FIG. 4, the integrated circuit may include a data receiver 401, a serial-to-parallel (S2P) conversion circuit 410, a serial-to-parallel (S2P) conversion circuit 420, a parallel-to-serial (P2S) conversion circuit 430, a serial-to-parallel (S2P) conversion circuit 440, and a parallel-to-serial (P2S) conversion circuit 450.

The data receiver 401 may receive data through the data pad DQ and transfer the data through the line 402 of the first section 101. A plurality of data may be serially received through the data pad DQ. For example, when the burst length BL is 4, four data may be successively received for one write command.

The serial-to-parallel conversion circuit 410 may perform a 1:2 serial-to-parallel conversion on the data transferred through the first section 101 so as to produce parallel data and transfer the parallel data through the two lines MIO_0 and MIO_1 of the second section 102. The data transferred through the lines MIO_0 and MIO_1 of the second section 102 may be understood with reference to FIG. 3.

The serial-to-parallel conversion circuit 420 may perform a 2:4 serial-to-parallel conversion on the data transferred through the second section 102 so as to produce parallel data and transfer the parallel data through the four lines TIO_0 to TIO_3 of the third section 103. The data transferred through the four lines TIO_0 to TIO_3 of the third section 103 may be understood with reference to FIG. 3.

The parallel-to-serial conversion circuit 430 may perform a 4:2 parallel-to-serial conversion on the data transferred through the third section 103 so as to produce serial data and transfer the serial data through the two lines TSV_0 to TSV_1 of the fourth section 104. The parallel-to-serial conversion circuit 430 may invert some data during the process of performing the 4:2 parallel-to-serial conversion on the data and transfer the inverted data. The parallel-to-serial conversion circuit 430 may include an inverter circuit 431 with two inverters and a parallel-to-serial (P2S) converter 432. The inverter circuit 431 may be used to invert the third data and the fourth data among the four data corresponding to one write command. The parallel-to-serial (P2S) converter 432 may be used for the parallel-to-serial conversion of the data. The data transferred through the two lines TSV_0 to TSV_1 of the fourth section 104 may be understood with reference to FIG. 3. The parallel-to-serial conversion circuit 430 may invert a portion of the data to make the data pattern in the fourth section 104 be different from the data patterns of the second section 102 and the sixth section 106. Alternatively, the parallel-to-serial conversion circuit 430 may invert data other than the third data and the fourth data among the four data.

The serial-to-parallel conversion circuit 440 may perform a 2:4 serial-to-parallel conversion on the data transferred through the fourth section 104 so as to produce parallel data and transfer the parallel data through the four lines GIO_0 to GIO_3 of the fifth section 105. The serial-to-parallel conversion circuit 440 may alternately perform an operation of transferring the data as they are and an operation of inverting the data and transferring the inverted data, whenever a write command is applied. The serial-to-parallel conversion circuit 440 may include a first serial-to-parallel (S2P) converter 441, a second serial-to-parallel converter 442, and an inverter 443.

The first serial-to-parallel converter 441 may be activated when an even strobe signal EVEN_STB is activated. Then, the first serial-to-parallel converter 441 may perform a 2:4 serial-to-parallel conversion on the data of the fourth section 104 so as to produce parallel data, and transfer the parallel data to the fifth section 105. The even strobe signal EVEN_STB may be activated when the write command is applied an even number of times. The second serial-to-parallel converter 442 may be activated when the odd strobe signal ODD_STB is activated, invert the data of the fourth section 104 and perform a 2:4 serial-to-parallel conversion on the inverted data of the fourth section 104 so as to produce parallel data, and transfer the parallel data to the fifth section 105. The odd strobe signal ODD_STB may be activated when the write command is applied an odd number of times. The first serial-to-parallel converter 441 may perform a serial-to-parallel conversion on the data, and the second serial-to-parallel converter 442 may invert the data and perform a serial-to-parallel conversion on the inverted data. Therefore, the data of the fifth section 105 may be transferred as they are or transferred after being inverted repeatedly whenever a write command is applied. Herein, the terms "even number" and "odd number" are used in a relative sense. In other words, when the command currently applied is an even-numbered command, the command to be applied next may be an odd-numbered command. The command applied first to the integrated circuit may be regarded as an even-numbered command or it may be regarded as an odd command. The inverter 443 may be used to invert the third data and the fourth data among the data transferred to the fifth section 105. The inverter 443 may be used to recover the data that was inverted by the inverter 431. The data in the four lines GIO_0 to GIO_3 of the fifth section 105 may be understood with reference to FIG. 3.

The parallel-to-serial conversion circuit 450 may perform a 4:2 parallel-to-serial conversion on the data transferred through the fifth section 105 so as to produce serial data and transfer the serial data through the two lines BIO_0 and BIO_1 of the sixth section 106. In order to restore the data inverted by the serial-to-parallel conversion circuit 440, the parallel-to-serial conversion circuit 450 may repeatedly perform an operation of transferring the data as they are and an operation of inverting the data and transferring the inverted data, whenever a write command is applied. The parallel-to-serial conversion circuit 450 may include a first parallel-to-serial (P2S) converter 451 and a second parallel-to-serial (P2S) converter 452.

The first parallel-to-serial converter 451 may be activated when a delayed even strobe signal EVEN_STB_D is activated, perform a 4:2 parallel-to-serial conversion on the data transferred through the fifth section 105 so as to produce serial data, and transfer the serial data to the sixth section 106. The delayed even strobe signal EVEN_STB_D may be generated by delaying the even strobe signal EVEN_STB by a time that the data is delayed in the fifth section 105. The second parallel-to-serial converter 452 may be activated when a delayed odd strobe signal ODD_STB_D is activated, invert the data transferred through the fifth section 105, and perform a 4:2 parallel-to-serial conversion on the inverted data so as to produce serial data, and transfer the serial data to the sixth section 106. The delayed odd strobe signal ODD_STB_D may be generated by delaying the odd strobe signal ODD_STB by a time that the data are delayed in the fifth section 105. The data inverted by the second serial-to-parallel converter 442 may be restored by the inversion operation of the second parallel-to-serial converter 452. The data in the two lines BIO_0 and BIO_1 of the sixth section 106 may be understood with reference to FIG. 3.

The integrated circuit of FIG. 4 may be a memory device, which may be configured with a plurality of chips that are stacked. For example, the first section 101 to the third section 103 may represent a path through which data is transferred in the lowest-layer chip, and the fourth section 104 may represent a path through which data is transferred between the stacked chips, and the fifth section 105 and the sixth section 106 may represent a path through which data is transferred in an upper-layer chip. FIG. 4 shows, by way of example, a case in which the present invention is applied to a path through which a data is transferred during a write operation. However, the present invention is not so limited. The teachings herein may be applied to a path through which data is transferred during a read operation.

In the above-described embodiments, a case in which four data are consecutively inputted to the data pad in response to one command, that is, the burst length BL is 4, is described. However, the present invention in not so limited. More generally, the burst length may N (where N is an integer of 2 or more). In this case, in a section where data are transferred through N lines, the pattern of the data may be changed by repeatedly performing a process of transferring the data as they are and a process of inverting the data and transferring the inverted data, whenever a command is applied. Consequently, it is possible to prevent the data from toggling at the same, or substantially the same, time in several sections and thereby prevent an abrupt increase in the peak current due to the data.

According to embodiments of the present invention, peak current occurring due to data transfer in an integrated circuit may be reduced.

While the present invention has been illustrated and described with respect to the specific embodiments, it will be apparent to those skilled in the art in light of the present disclosure that various changes and modifications may be made without departing from the spirit and scope of the invention as defined in the following claims.

What is claimed is:

1. An integrated circuit, comprising:
   one or more first sections in which first to Nth data, where N is an integer greater than or equal to 2, corresponding to one command are transferred through one line;
   two or more second sections in which the first to Nth data are serial-to-parallel converted 1:N and transferred through N lines; and
   two or more third sections in which the first to Nth data are serial-to-parallel converted 1:2 and transferred through two lines,
   wherein, whenever the command is applied, the first to Nth data are transferred without being inverted or transferred after being inverted repeatedly in at least one second section among the two or more second sections, and
   wherein select data among the first to Nth data is inverted and transferred in at least one third section among the two or more third sections.

2. The integrated circuit of claim 1, wherein the integrated circuit is a memory device, and the command is one of a read command and a write command.

3. The integrated circuit of claim 2, wherein the memory device includes two or more memory chips that are stacked.

4. An integrated circuit, comprising:
   a first section in which first to fourth data corresponding to one command are transferred through one line;
   a second section in which the first to fourth data transferred through the first section are serial-to-parallel converted 1:2 and transferred through two lines;
   a third section in which the first to fourth data transferred through the second section are serial-to-parallel converted 2:4 and transferred through four lines;
   a fourth section in which the first to fourth data transferred through the third section are parallel-to-serial converted 4:2 and transferred through two lines;
   a fifth section in which the first to fourth data transferred through the fourth section are serial-to-parallel converted 2:4 and transferred through four lines; and
   a sixth section in which the first to fourth data transferred through the fifth section are parallel-to-serial converted 4:2 and transferred through two lines,
   wherein select data among the first to fourth data is inverted and transferred in at least one section among the second section, the fourth section, and the sixth section, and whenever the command is applied, the first to fourth data are transferred without being inverted or transferred after being inverted repeatedly in at least one section among the third section and the fifth section.

5. The integrated circuit of claim 4, further comprising:
   a first parallel-to-serial conversion circuit suitable for performing a 4:2 parallel-to-serial conversion on the first to fourth data transferred through the third section,
   wherein the first parallel-to-serial conversion circuit performs a parallel-to-serial conversion after inverting third data and fourth data among the first to fourth data transferred through the third section.

6. The integrated circuit of claim 4, further comprising:
   a serial-to-parallel conversion circuit suitable for performing a 2:4 serial-to-parallel conversion on the first to fourth data transferred through the fourth section,
   where the serial-to-parallel conversion circuit includes:

a first serial-to-parallel converter that is activated when the command is applied an even number of times, and performing a 2:4 serial-to-parallel conversion on the first to fourth data;

a second serial-to-parallel converter that is activated when the command is applied an odd number of times, and performing a 2:4 serial-to-parallel conversion on the first to fourth data; and an inverter suitable for inverting the third data and the fourth data among the first to fourth data to be transferred through the fifth section.

7. The integrated circuit of claim 4, further comprising:

a second parallel-to-serial conversion circuit suitable for performing a 4:2 parallel-to-serial conversion on the first to fourth data transferred through the fifth section, where the second parallel-to-serial conversion circuit includes:

a first parallel-to-serial converter that is activated when the command is applied an even number of times, and performing a 4:2 parallel-to-serial conversion on the first to fourth data; and a second parallel-to-serial converter that is activated when the command is applied an odd number of times, and performing a 4:2 parallel-to-serial conversion on the first to fourth data.

8. The integrated circuit of claim 4, wherein the integrated circuit is a memory device, and the command is one of a read command and a write command.

9. The integrated circuit of claim 8, wherein the memory device includes two or more memory chips that are stacked.

* * * * *